United States Patent [19]

Dufft

[11] 4,013,915
[45] Mar. 22, 1977

[54] LIGHT EMITTING DEVICE MOUNTING ARRANGEMENT

[75] Inventor: William Henry Dufft, Shillington, Pa.

[73] Assignee: Bell Telephone Laboratories, Incorporated, Murray Hill, N.J.

[22] Filed: Oct. 23, 1975

[21] Appl. No.: 625,022

[52] U.S. Cl. .............................. 313/499; 313/112; 313/512; 350/167
[51] Int. Cl.² ........................................ H05B 33/02
[58] Field of Search ........... 350/167; 313/112, 499, 313/500, 501, 512; 250/552, 553; 357/17, 18, 19

[56] References Cited

UNITED STATES PATENTS

| | | | |
|---|---|---|---|
| 3,512,027 | 5/1970 | Kupsky | 313/108 |
| 3,555,335 | 1/1971 | Johnson | 313/499 |
| 3,739,217 | 6/1973 | Bergh et al. | 313/108 |
| 3,764,862 | 10/1973 | Jankowski | 313/499 |
| 3,780,357 | 12/1973 | Haitz | 317/234 |
| 3,786,499 | 1/1974 | Jankowski et al. | 340/378 R |
| 3,816,847 | 6/1974 | Nagao | 357/17 |
| 3,821,590 | 6/1974 | Kosman | 313/499 |
| 3,863,075 | 1/1975 | Ironmonger | 313/499 |
| 3,876,900 | 4/1975 | Amatsuka | 313/510 |

Primary Examiner—John Kominski
Attorney, Agent, or Firm—Lester H. Birnbaum

[57] ABSTRACT

A mounting scheme designed to provide enhanced brightness and off-axis viewing of a discrete light emitting device is described. The device is placed within a cavity with reflecting side walls. Situated above the cavity is a contrast filter which has formed therein a plurality of spherical lenses. The lens arrangement is designed to produce an array of discrete images of the device separated by dark areas in order to increase the visibility of the device. The cavity side walls reflect onto the lenses light which would not normally be incident thereon thereby further enhancing visibility and permitting good off-axis viewing.

6 Claims, 4 Drawing Figures

LIGHT EMITTING DEVICE MOUNTING ARRANGEMENT

BACKGROUND OF THE INVENTION

This invention relates to a mounting arrangement for light emitting devices, and in particular for semiconductor light emitting diodes.

Semiconductor light emitting diodes have recently found extensive use as replacements for filament bulbs in a wide variety of applications. Their small size, low power consumption and long life makes them attractive for such uses as indicator lamps in key telephone sets and switchboards. Careful consideration must be given in such uses for distributing the light to produce maximum impact on the viewer. In this regard, the small size of the diode (approx. 15 mils on each side) is a drawback since light is emitted from too small an area for good viewing. In order to overcome this problem, it is necessary to spread the light over a larger area while maintaining sufficient brightness. This may be accomplished for example by use of parabolic reflectors (see, e.g., U.S. Pat. No. 3,512,027 issued to Kupsky) or various lens arrangements for providing a diffuse image of the light (see, e.g., U.S. Pat. No. 3,780,358 issued to Haitz). In one approach, a faceted reflector is used to create several images of the diode (see U.S. Pat. No. 3,555,335 issued to B.H. Johnson). Another problem associated with the use of semiconductor diodes as indicator lamps is to provide enough contrast so that when the light is on it will be visible against its background, and when it is off reflected light from the ambient will not make it appear that it is on. To overcome this effect contrast filters are usually provided.

A further problem which should be overcome is the provision for good off-axis viewing. That is, the light should be visible over a wide angular range in order to be viewable from different areas of a room.

It is therefore a primary object of the invention to provide a mounting arrangement for semiconductor light emitting devices which produces a maximum impact of the emitted light on the viewer.

SUMMARY OF THE INVENTION

This and other objects are achieved in accordance with the invention. The light emitting device is placed in a cavity having reflecting side walls. Placed above the cavity is a contrast filter, one surface of which has formed therein in array of spherical surfaces. These surfaces, which are concave, behave like an array of spherical lenses in order to create an array of light spots of approximately equal intensity separated by dark areas. Off-axis viewing is also enhanced by the combination of reflecting side walls and filter lens arrangement.

BRIEF DESCRIPTION OF THE DRAWING

These and other features of the invention will be delineated in detail in the description to follow. In the drawing:

FIG. 3 is an enlarged view of a portion of the embodiment of FIG. 1 which illustrates the effect of the filter lenses on representative light rays viewable head on.

It will be realized that for purposes of illustration, these figures are not necessarily drawn to scale.

DETAILED DESCRIPTION OF THE INVENTION

Figure 1:
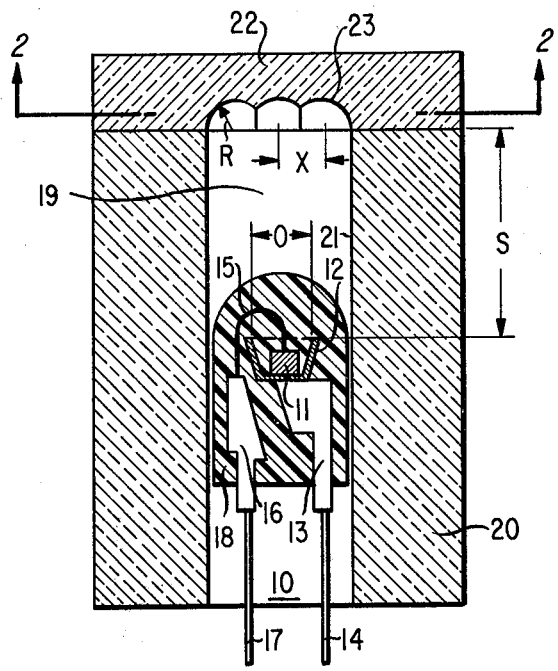
FIG. 1 is a cross-sectional view of a light emitting diode and mounting arrangement in accordance with one embodiment of the invention.

The basic elements of one embodiment of the invention are shown in FIG. 1. A standard light emitting diode is shown generally as 10. It includes a GaP chip 11 which emits light in response to an applied bias. The chip usually comprises n-type GaP upon which is grown a layer of p-type GaP which includes dopants of zinc and oxygen to provide recombination centers. For the sake of simplicity, the diode is shown as a single block. It will be understood that the mounting arrangement of the present invention may be used with a variety of semiconductor light emitting devices, including GaAsP devices. It will also be realized that more than one diode may be mounted in the cavity if desired. The device is placed in a reflecting pan, 12, which is usually gold-plated nickel shaped like a truncated cone in order to reflect in an upward direction any light emitted from the sides of the device. The pan is mounted on one member 13 of a standard lead frame in order to make contact to the bottom of the device through lead 14. The top of the device is contacted by wire 15 electrically coupled to another member 16 of the lead frame which is in turn coupled to lead 17. The device is usually encapsulated in a transparent material, 18, such as epoxy casting or transfer molding resins, in order to protect the device from the ambient and support the lead structure. It will be realized that the particular form of diode shown here is primarily for the purpose of illustration and many variations are possible.

The diode is placed within a cavity 19 formed by side member 20. The latter may comprise any material so long as the cavity walls 21 are made spectrally reflecting. This can be accomplished, for example, by coating the walls with a material such as aluminum. The cavity may advantageously be octagonal, hexagonal, or rectangular in shape depending on particular needs. The cavity should have flat surfaces in order to reflect the light as described below.

Placed above the side member 20 is a filter element 22. This element may be any transparent material, but is most advantageously composed of a molded plastic material such as acrylic or polycarbonate. The filter element is dyed a suitable color so that the light emitting device will appear "on" only when it is actually emitting light and reflected light from the ambient is kept at a minimum. For example, if a green emitting diode is utilized, the filter can be a green dyed acrylic of such a shade so as to effect a band pass filter (that is, it will transmit essentially only the light emitted by the diode). Light reflected from the ambient will pass through the filter twice before striking the viewer's eye whereas light from the diode passes through the filter only once before reaching the viewer's eye. Ambient light reflection thus suffers twice the attenuation as does the light from the diode. Density of the dye in the filter will depend on the specific application and ambient light level and should be adjusted to give an unambiguous on-off indication.

It will be appreciated that although filter element 22 and side member 20 are shown as separate elements, it may be desirable to form both in a single unit.

Figure 2:
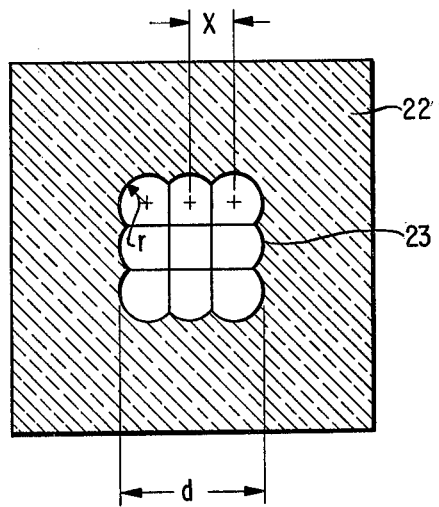
FIG. 2 is a view along line 2—2 of FIG. 1.
Figure 3:
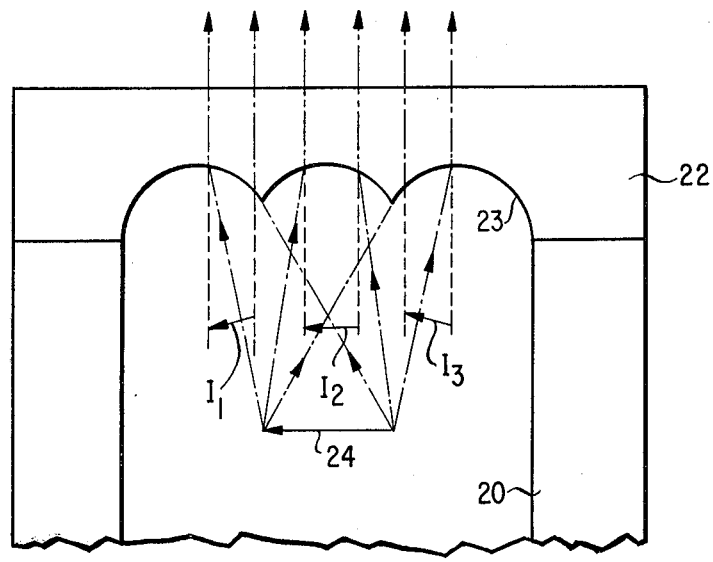

In accordance with a key feature of the invention, there is formed on the underside of the filter 22 over the cavity an array of essentially spherical surfaces such as 23. The full array is shown in FIG. 2, which is a view taken along line 2—2 of FIG. 1. It will be noted that these spherical segments produce the straight line boundaries at the interior of the array as shown in FIGS. 1 and 2. This overlap is advantageous to form a closely spaced array of images as described below. The surfaces can be formed, however, so that each is in the form of a complete hemisphere if so desired rather than spherical segments. Preferably, the segments should be formed such that the distance between axes of adjacent spherical surfaces, $x$, is equal to $2r/\sqrt{2}$, where $r$ is the radius of the circle formed by the spherical segments in the horizontal plane at the bottom surface of the filter. This spacing forms an array of segments without any planar surfaces in between so that a viewer will see only images formed by the spherical surfaces as described below and not the diode itself. In any event, the term "spherical" surfaces as used in this application is intended to include the embodiments of spherical segments and discrete hemispheres. It is important to note that the surfaces are concave in order to achieve the result contemplated by the invention. To illustrate this point, representative light rays in FIG. 3 are shown emanating from the diode-reflector combination which in this figure is represented by line 24. The light rays shown 70 those relevant to viewing from position 25 which is on the axis of the diode, i.e., at an angle of 90° from the surface of the filter element 22. It will be seen that the rays are refracted at the concave surfaces 23 so that images $I_1$, $I_2$, and $I_3$ of the object 24 are formed at some distance from the surface depending upon the magnification desired. In the two dimensional illustration of FIG. 3, three such images are shown, but it will be clear that in this particular embodiment, nine such images will be formed. Therefore, what the eye sees at position 25, essentially normal to the surface of the filter, is an array of nine discrete images of the diode and reflecting pan separated by dark areas. Further, each image has approximately the same brightness as that produced by the diode and reflecting pan without such a lens arrangement. This high intensity pattern has a much higher visual impact than would the diode itself or an evenly illuminated cavity of the same area and luminous flux. It is therefore important to distinguish proposals for LED mounting arrangements which provide for an array of convex lenses (see, e.g., U.S. Pat. No. 3,786,499 issued to Jankowski et al.). These schemes are designed to diffuse the light so as to get even illumination along an aperture for alpha-numeric displays, whereas the present structure is designed to achieve discrete images of the light.

Figure 4:
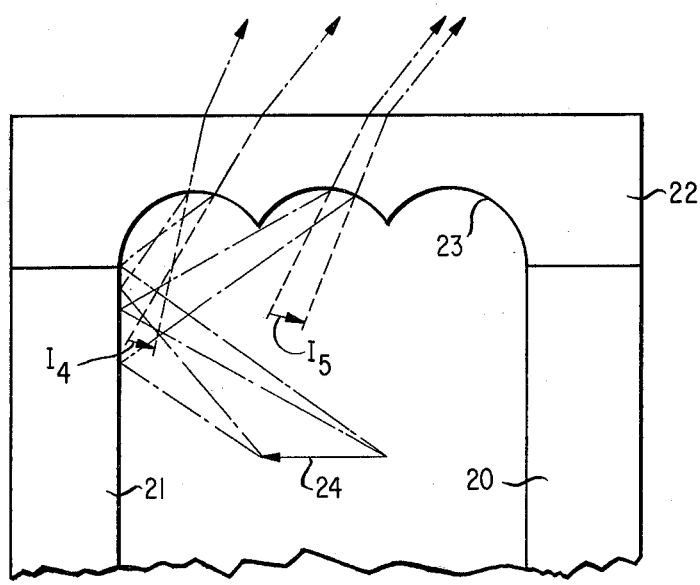
FIG. 4 is an enlarged view of a portion of the embodiment of FIG. 1 which illustrates the effect of the filter lenses and cavity walls on representative light rays visible in off-axis viewing.

The effect of good off-axis viewing resulting from the present invention is illustrated by the representative rays emanating from object 24 in FIG. 4. These rays are viewable at a position such as 26 which is off the axis by, for example, approximately 70°. It will be noted that the representative rays are reflected at the cavity surface 21 and are refracted by the concave surfaces so as to form images $I_4$ and $I_5$ of the object 24 which are visible at a range of approximately 30°–90° off the axis. These images are also approximately the same brightness as the original object. Thus, the combination of the reflecting side walls and refraction of the reflected rays at both the concave surfaces and flat upper surface of the filter element produce bright images at a wider viewing angle than is possible with most standard mounting arrangements. It will also be noted that such wide angle viewing is achieved by a structure with a flat upper surface for advantageous use with flat panel surfaces.

It will be appreciated that for the sake of clarity of illustration, not all the images viewable off the axis are shown in FIG. 4. For example, at position 26, the image $I_3$ of FIG. 3 would also be visible, and depending on the angle from the axis, $I_2$ may also be visible. Also, it will be noted that images corresponding to $I_4$ and $I_5$ would be formed and would be visible from the side of the axis opposite to that shown in FIG. 4. Extension of the ray principles to the three dimensional array of lenses should be straightforward.

It will be appreciated that the radius of curvature, R, of the spherical surfaces (see FIG. 1), the distance S, of the object to the filter element and the side dimension, $d$, of the lens array (see FIG. 2) can be varied according to particular needs. The only requirement is that the multiple images be formed as previously described, and the combination of parameters which will produce this result can be easily determined. In one example, the lens array was to have a viewing area of 0.140 × 0.140 inch. The radius, R, was 0.0312 inch, the side dimension $d$ was 0.145 inch, the object size (0 of FIG. 1) was 0.060 inch, and the object distance S was approximately 0.145 inch. These dimensions resulted in the multiple images previously described of adequate size and brightness for easy viewing.

Certain criteria should be kept in mind in constructing such a mounting arrangement. For example, the side dimension of the cavity should be at least the length of the side dimension of the lens array but not significantly larger or light will be lost in the outer corners of the cavity-filter interface. Also, the radius of curvature, R, determines the position of $I_3$ relative to the top edge of the cavity. Thus, increasing R moves $I_3$ deeper into the cavity which reduces the angle at which it is visible. For example, for $d = 0.145$ inch and R = 0.0312 inch, the viewing angle is 90°, whereas if R = 0.0391 inch the viewing angle is reduced to 40° and for R = 0.0469 inch the angle is further reduced to 30°.

Various additional modifications will become apparent to those skilled in the art. All such variations which basically rely on the teachings through which the invention has advanced the art are properly considered within the spirit and scope of the invention.

What is claimed is:

1. An optical device comprising:
  a solid state light-emitting device;
  a body of material defining a cavity with side walls and an opening at the top within which cavity is mounted said light-emitting device, the walls of said cavity forming spectrally reflective surfaces; and
  a filter element having top and bottom surfaces formed over the opening in said cavity with the top surface facing away from the cavity and the bottom surface facing the cavity wherein said top surface is flat and said bottom surface includes a plurality of spherical surfaces formed therein in the area over said cavity with the concave side of the surfaces facing said cavity such that a plurality of images of said light-emitting device is formed by said surfaces.

2. The optical device according to claim 1 wherein the distance between the axes of adjacent spherical surfaces is $2r/\sqrt{2}$, where $r$ is the radius of the circle formed by the spherical surfaces in a horizontal plane at the bottom surface of said filter element.

3. The optical device according to claim 1 wherein said filter element includes an array of at least nine spherical surfaces.

4. The optical device according to claim 1 wherein the light-emitting device comprises a GaP light-emitting diode and further includes a reflecting pan within which the diode is positioned.

5. The device according to claim 1 wherein said material defining the cavity and said filter element are formed from the same material.

6. The device according to claim 1 wherein the side dimensions of said cavity are at least equal to the side dimensions of said array of spherical surfaces.

* * * * *